United States Patent [19]

Kielmeyer, Jr.

[11] Patent Number: 4,873,497

[45] Date of Patent: Oct. 10, 1989

[54] WIDE BAND VOLTAGE CONTROLLED R-C OSCILLATOR FOR USE WITH MMIC TECHNOLOGY

[75] Inventor: Ronald F. Kielmeyer, Jr., Chandler, Ariz.

[73] Assignee: Motorola, Inc., Schaumburg, Ill.

[21] Appl. No.: 252,204

[22] Filed: Oct. 3, 1988

[51] Int. Cl.$^4$ .............................................. H03B 5/24
[52] U.S. Cl. ................................ 331/108 B; 331/135; 331/177 R
[58] Field of Search ........... 331/108 B, 108 C, 108 D, 331/111, 13 J, 136, 137, 177 R

[56] References Cited

U.S. PATENT DOCUMENTS 3,130,377  4/1964  Brown et al. .................... 331/136 X
3,345,582  10/1967  Maupin ............................ 331/137 X

OTHER PUBLICATIONS

Hara et al., "Broad Band Monolithic Microwave Active Inductor and Application to a Miniaturized Wide Band Amplifier", IEEE 1988 Microwave and Millimeter-Wave Monolithic Circuits Symposium, pp. 117-120, Jun. 1988.

Primary Examiner—Siegfried H. Grimm
Attorney, Agent, or Firm—Jordan C. Powell

[57] ABSTRACT

A wide band tunable microwave oscillator for monolithic microwave integrated circuits. The oscillator does not use varactors or inductors for oscillation, but uses a voltage variable resistor coupled to a first MESFET supplying a capacitance, and to an amplifying element to create an RC oscillator. The voltage variable resistor is a second MESFET coupled to a variable voltage source. The oscillator takes advantage of the gate capacitance of the first MESFET, as well as the gain available from using an active element within the feedback loop.

18 Claims, 1 Drawing Sheet

WIDE BAND VOLTAGE CONTROLLED R-C OSCILLATOR FOR USE WITH MMIC TECHNOLOGY

BACKGROUND OF THE INVENTION

This invention relates, in general, to voltage controlled oscillators, and more specifically, to wide band voltage controlled oscillators used in monolithic microwave integrated circuits (MMIC).

Oscillators used in MMIC circuits have used inductors and varactor capacitors to achieve wide band widths. The use of varactors has required external tuning elements, as well as multiple tuning elements. Multiple tuning elements have inherent problems such as switching transients. The low Q nature of varactor diodes also limits the performance of the MMIC circuit. Use of inductors require MMIC's to be proportionately large. Inherent with the use of inductors is low yield, lower frequencies obtainable and proportionately large inductor size. Given the external, multiple tuning elements and the proportionately large inductors, use of MMIC wideband voltage controlled oscillators (WBVCO) has been somewhat limited. If WBVCO's could be reduced in size and entirely incorporated on a single chip with higher yields and broader frequency ranges, MMIC WBVCO's could be used in many new applications.

SUMMARY OF THE INVENTION

It is, therefore, an object of the present invention to provide a wide band oscillator which can be voltage tuned without using external tuning elements.

Another object of the present invention is to provide a voltage tuned wide band oscillator which does not require varactors or inductors and can be reduced in size.

A further object of the present invention is to provide a voltage tuned wide band oscillator which requires only one voltage control source to achieve the wide band width.

In accordance with the foregoing objects, a MMIC WBVCO is contemplated which utilizes several metal semiconductor field effect transistors (MESFET) to form an RC VCO. Two MESFET's are coupled to form an amplifier which may be in the form of a cascode amplifier. Two additional MESFET's are included in the feedback loop, one operating as a voltage controlled resistor and another supplying capacitance and operating to increase the feedback gain. These MESFET's allow high yield, a broad range of frequencies, and require only one tuning element.

Other objects and advantages of the present invention will become apparent from the following detailed description, particularly when considered in conjunction with the accompanying drawings.

DETAILED DESCRIPTION OF THE PREFERRED EMBODIMENT

Monolithic microwave integrated circuits (MMIC) have been developed to reduce microwave circuits to very small sizes similar to integrated circuit chips used in lower frequencies and constructed on silicon wafers. Generally, MMIC's use gallium arsenide (GaAs) instead of silicon because GaAs circuits can operate at the higher microwave frequencies which silicon conterparts are incapable of obtaining. The present invention contemplates a new oscillator designed for use within MMIC technology.

Figure 1:
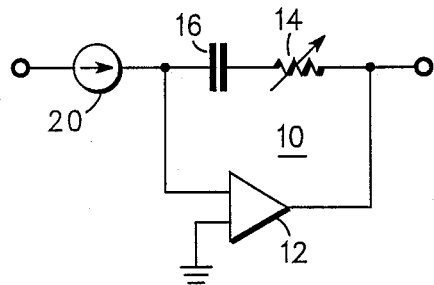
FIG. 1 is a simplified schematic diagram of a MMIC wide band tunable oscillator according to the present invention.

FIG. 1 shows a basic schematic of the present invention. Specifically, an oscillator 10 is shown in its preferred embodiment which comprises an amplifier 12, a variable resistance 14, and a capacitance 16. Oscillator 10 is an RC oscillator and does not require large inductors. All elements of oscillator 10 are incorporated on a single MMIC chip rather than utilizing external elements such as discrete inductor, varactor capacitor, resistor, or Yttrium Iron Garnet (YIG) elements. By using an RC oscillator instead of an LC oscillator, and by eliminating external elements, oscillator 10 can be used in many products where use of other microwave oscillators was impractical.

Resistance 14 and capacitance 16 comprise the feedback loop of an RC oscillator. To have oscillation within oscillator 10, the gain throughout the loop comprising amplifier 12, resistance 14, and capacitance 16 must be equal to or greater than one (1), and the phase must be zero or three hundred and sixty (360) degrees. As the electric signal leaves amplifier 12, it has a gain of m and a phase angle of $\phi_m$. As the signal continues through the feedback loop, it has an additional gain of n and a phase angle of $\phi_m$. For oscillation to occur, m times n must be greater than 1, and $\phi_m$ plus $\phi_m$ must equal 360 degrees. Since m is a very small number, n must be very large for oscillation. However, at microwave frequencies, amplifier 12 is incapable of supplying sufficient gain n to compensate for the very small gain m in resistance 14 and capacitance 16. For this reason, conventional MMIC oscillators have used inductor/capacitor combinations, or LC oscillators. A preferred embodiment of the present invention uses an active element, or voltage controlled current source 20 to supply the necessary open loop gain (m×n) to be greater than or equal to one.

Figure 2:
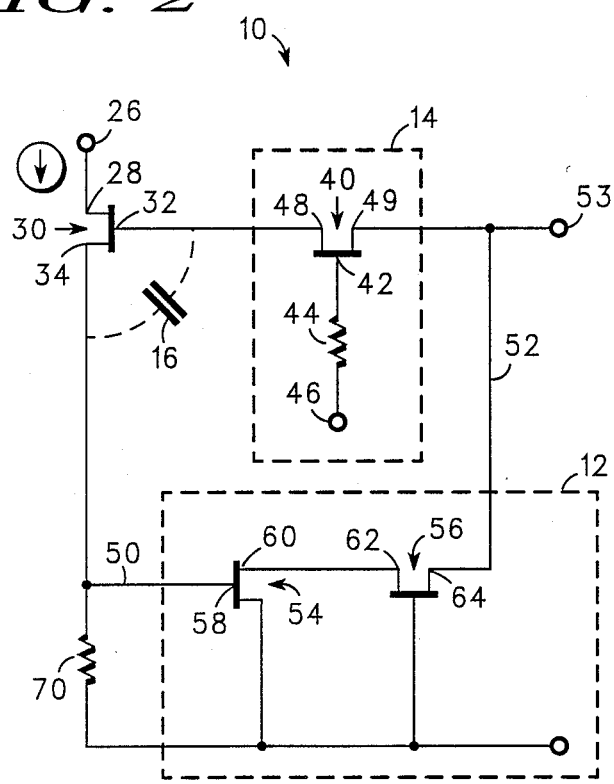
FIG. 2 is an expanded schematic diagram of FIG. 1 according to the present invention.

To incorporate oscillator 10 on a single MMIC chip, a series of metal semiconductor field effect transistors are contemplated to replace the discrete elements as shown in FIG. 2. In a preferred embodiment, a first MESFET 30 replaces capacitance 16 and voltage controlled current source 20, with a gate 32 coupled to the feedback loop to take advantage of the gate capacitance of the MESFET (indicated by the dashed line and capacitance 16 in FIG. 2). Resistance 14 comprises second MESFET 40 coupled at gate 42 to resistor 44. Resistor 44 is coupled to a variable voltage source at port 46. By varying the DC voltage applied at port 46 by the variable voltage source, the resistance value of resistance 14 can also be varied. Drain 48 of second MESFET 40 is coupled to gate 32 of first MESFET 30. A source 34 of first MESFET 30 is coupled to an input 50 of amplifier 12, and at terminal 28 is coupled to a DC voltage source (not shown) at terminal 26 to bias MESFET 30. An output 52 of amplifier 12 is coupled to a source 49 of second MESFET 40. Resistor 70 is coupled to source 34 for DC biasing of MESFET 30.

Amplifier 12 comprises third MESFET 54 and fourth MESFET 56. Gate 58 of third MESFET 54 is coupled to source 34 of first MESFET 30 to form input 50.

Drain 60 of third MESFET 54 is coupled to a source 62 of fourth MESFET 56. A drain 64 of fourth MESFET 56 is coupled to source 49 of second MESFET 40 to form output 52 of amplifier 12. Output 52 is coupled to node 53 where a DC bias is applied, and where an oscillating signal at microwave frequency is extracted.

In operation, the DC bias applied at node 53 creates noise within first MESFET 30 and second MESFET 40 to begin oscillation. The DC voltage applied at node 53 also activates amplifier 12. The oscillating signal created within oscillator 10 is then output through node 53.

By utilizing several MESFET's and eliminating the need for discrete components, the entire microwave oscillator can be constructed on a single MMIC chip. Construction of MESFET's on MMIC chips further allows for higher yields and broadens the applications of WBVCO's.

Thus there has been provided, in accordance with the invention, a wide band voltage controlled oscillator for use with MMIC technology that fully satisfies the objects, aims, and advantages set forth above. While the invention has been described in conjunction with specific embodiments thereof, many alternatives, modifications, and variations will be apparent to those skilled in the art in light of the foregoing description. Accordingly, the foregoing description is intended to embrace all such alternatives, modifications, and variations as fall within the spirit and broad scope of the appended claims.

I claim:

1. A wide band tunable microwave oscillator for monolithic microwave integrated circuits comprising:
   feedback loop means for providing a feedback signal for oscillation, said feedback loop means comprising:
   transistor capacitance means for supplying gain and phase shift for oscillation, said transistor capacitance means including an input and an output;
   variable resistor means for supplying a voltage variable resistance, said variable resistor means having a first input and an output coupled to said input of said transistor capacitance means; and
   amplifier means for providing an amplification to said feedback signal, said amplifier means including an input coupled to said output of said transistor capacitance means, and an output coupled to said first input of said variable resistor means.

2. A wide band tunable microwave oscillator for monolithic microwave integrated circuits according to claim 1 wherein said amplifier means comprises:
   a first transistor having an input gate coupled to said output of said transistor capacitance means and an output drain; and
   a second transistor including an input source coupled to said output drain of said first transistor, and an output drain coupled to said input of said variable resistor means.

3. A wide band tunable microwave oscillator for monolithic microwave integrated circuits according to claim 2 wherein said variable resistor means comprises a metal-semiconductor field effect transistor (MESFET) having an input source coupled to said drain output of said second transistor, an output drain coupled to said input of said transistor capacitance means, and a gate coupled to a variable voltage source.

4. A wide band tunable microwave oscillator for monolithic microwave integrated circuits according to claim 3 wherein said MESFET is a gallium arsenide (GaAs) MESFET.

5. A wide band tunable microwave oscillator for monolithic microwave integrated circuits according to claim 1 wherein said transistor capacitance means comprises a MESFET having an input gate coupled to said output of said variable resistor means and an output source coupled to said input of said amplifier means.

6. A wide band tunable microwave oscillator for monolithic microwave integrated circuits according to claim 5 wherein said MESFET includes a GaAs MESFET.

7. A wide band tunable microwave oscillator for monolithic microwave integrated circuits according to claim 5 wherein said MESFET includes a high electron mobility transistor (HEMT).

8. A wide band tunable microwave oscillator for monolithic microwave integrated circuits according to claim 3 wherein said MESFET includes a HEMT.

9. A method for making a variable resistance RC type microwave oscillator for use in a monolithic microwave integrated circuit comprising the steps of:
   supplying a first transistor having a gate capacitance;
   coupling an input of said first transistor to an output of a second transistor operating as a voltage variable resistor;
   coupling an output of said first transistor to an input of an amplifing element; and
   coupling an output of said amplifing element to a first input of said second transistor.

10. A method for making a variable resistance RC type microwave oscillator for use in a monolithic microwave integrated circuit according to claim 9 wherein said method further comprises coupling a second input of said second transistor to a variable voltage source.

11. A wide band tunable microwave oscillator for monolithic microwave integrated circuits comprising:
    feedback loop means for providing a feedback signal for oscillation, said feedback loop means comprising:
    transistor capacitance means for supplying gain and phase shift for oscillation, said transistor capacitance means including an input and an output;
    variable resistor means for supplying a voltage variable resistance, said variable resistor means having a first input and an output coupled to said input of said transistor capacitance means;
    first transistor means having an input coupled to said output of said transistor capacitance means and an output;
    second transistor means including an input coupled to said output of said first transistor means, and an output coupled to said input of said variable resistor means; and
    said first and second transistor means for providing an amplification to said feedback signal.

12. A wide band tunable microwave oscillator for monolithic microwave integrated circuits according to claim 11 wherein said variable resistor means comprises a metal-semiconductor field effect transistor (MESFET) having a first input coupled to said output of said second transistor means, an output coupled to said input of said transistor capacitance means, and a second input.

13. A wide band tunable microwave oscillator for monolithic microwave integrated circuits according to claim 12 wherein said second input of said variable resistor means MESFET is coupled to a variable voltage source.

14. A wide band tunable microwave oscillator for monolithic microwave integrated circuits according to claim 12 wherein said MESFET includes a gallium arsenide (GaAs) MESFET.

15. A wide band tunable microwave oscillator for monolithic microwave integrated circuits according to claim 11 wherein said transistor capacitance means comprises a MESFET having an input coupled to said output of said variable resistor means and an output coupled to said input of said first transistor means.

16. A wide band tunable microwave oscillator for monolithic microwave integrated circuits according to claim 15 wherein said MESFET includes a GaAs MESFET.

17. A wide band tunable microwave oscillator for monolithic microwave integrated circuits according to claim 15 wherein said MESFET includes a high electron mobility transistor (HEMT).

18. A wide band tunable microwave oscillator for monolithic microwave integrated circuits according to claim 12 wherein said MESFET includes a HEMT.

* * * * *